United States Patent
Hwu et al.

(10) Patent No.: US 8,575,645 B2
(45) Date of Patent: Nov. 5, 2013

(54) THIN MULTI-LAYER LED ARRAY ENGINE

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 108 days.

(21) Appl. No.: 13/301,782

(22) Filed: Nov. 22, 2011

(65) Prior Publication Data

US 2013/0126913 A1 May 23, 2013

(51) Int. Cl.
*H01L 33/00* (2010.01)

(52) U.S. Cl.
USPC ............... 257/99; 257/100; 257/E33.058

(58) Field of Classification Search
USPC .............................. 257/88, 98–100
See application file for complete search history.

(56) References Cited

U.S. PATENT DOCUMENTS

| | | | |
|---|---|---|---|
| 7,541,669 B2 * | 6/2009 | Carberry et al. | 257/676 |
| 8,058,667 B2 * | 11/2011 | Tran et al. | 257/99 |
| 2004/0046242 A1 * | 3/2004 | Asakawa | 257/678 |
| 2005/0218421 A1 * | 10/2005 | Andrews et al. | 257/100 |
| 2006/0124954 A1 * | 6/2006 | Akaishi | 257/99 |
| 2006/0180824 A1 * | 8/2006 | Kim et al. | 257/99 |
| 2007/0063321 A1 * | 3/2007 | Han et al. | 257/675 |
| 2007/0205425 A1 * | 9/2007 | Harada | 257/98 |
| 2007/0210325 A1 * | 9/2007 | Park et al. | 257/98 |
| 2007/0262328 A1 * | 11/2007 | Bando | 257/79 |
| 2008/0042151 A1 * | 2/2008 | Oh et al. | 257/88 |
| 2008/0210964 A1 * | 9/2008 | Tomioka | 257/98 |
| 2008/0303052 A1 * | 12/2008 | Lee et al. | 257/99 |
| 2010/0133554 A1 * | 6/2010 | Hussell | 257/88 |

* cited by examiner

*Primary Examiner* — Benjamin Sandvik

(57) ABSTRACT

A thin multi-layer LED array engine is provided, which includes a substrate having a phosphor layer and a silica gel protection layer formed thereon. The phosphor layer is disposed on LED dices and makes direct contact with the substrate, and the silica gel protection layer is disposed on the phosphor layer. The LED dices are covered with the phosphor layer, and thereby the phosphor particles in the phosphor layer can be uniformly dispersed around the LED dices, so that the narrow color temperature distribution can be achieved. Furthermore, the phosphor layer makes direct contacts with the substrate, and thereby heat generated in the phosphor layer can be effectively dissipated through the substrate, and thereby the reliability of the optical components can be increased.

23 Claims, 12 Drawing Sheets

THIN MULTI-LAYER LED ARRAY ENGINE

BACKGROUND OF THE INVENTION

1. Field of the Invention

The present invention relates to an LED (light-emitting diode) device, and particularly relates to a thin multi-layer LED array engine with enhanced light-mixing effect, which is capable of effectively dissipating heat generated in a phosphor layer.

2. The Prior Arts

The light-emitting theory of LED takes advantage of the intrinsic properties of semiconductors, which is different from the theory of electric discharging, heat and light-emitting of an incandescent light tube. Because light is emitted when electric current flows forward across the PN junction of a semiconductor, the LED is also called cold light. The LED has the features of high durability, long service life, light weight, low power consumption, and being free of toxic substances like mercury, and thereby it can be widely used in the industry of luminance equipment, and the LEDs are often arranged in an array and often used in such as electric bulletin board or traffic sign.

Please refer to Taiwanese Utility Model Patent No. M398686, which disclosed an airtight multi-layer array type LED packaging structure. FIG. 1 is a cross-sectional view of a conventional airtight multi-layer LED array engine packaging structure. Referring to FIG. 1, the airtight multi-layer LED array engine packaging structure includes a substrate 1a, an airtight metal frame 11a formed on the substrate 1a, a plurality of LED dices 5a formed on the top surface of the substrate 1a, a dice protection layer 7a, a phosphor layer 8a, and a silica gel protection layer 9a are sequentially formed on the LED dices 5a, and a dice protection layer 7a is formed on the LED dices 5a for protecting the LED dices 5a. The phosphor layer 8a is formed between the dice protection layer 7a and the silica gel protection layer 9a. The silica gel protection layer 9a is capable of preventing moisture from permeating into the phosphor layer 7a. Therefore, the phosphor layer 7a will not be deteriorated by exposure to moisture.

However, the conventional multi-layer array type LED package has un-uniform distribution of color temperature. The LED dices 5a emit light from different directions, and the light paths in the phosphor layer 8a are different, and thereby the distance past through the phosphor layer 8a is different. A part of the light emitted at large angle will be reflected by the sidewall of the LED package, and will enter the phosphor layer 8a again, and thereby the light path in the phosphor layer 8a will become long, so that the conventional LED package tends to emit light having light pattern with yellow halo phenomenon at the periphery.

Another disadvantage of the conventional multi-layer array type LED package is that heat generated in the phosphor layer 8a cannot be effectively dissipated out. Although the light source (i.e. the LED dices 5a) is spaced apart from the phosphor layer 8a, the phosphor layer 8a is still involved in radiation heat transfer from the LED dices 5a. However, heat cannot be effectively dissipated out from the phosphor layer 8a formed between the dice protection layer 7a and the silica gel protection layer 9a, and consequently, the phosphor layer 8a is deteriorated and has the problem of poor light mixing effect.

Therefore, there is a need to provide a thin multi-layer LED array engine, which has enhanced light-mixing effect, and is capable of effectively dissipating heat generated in a phosphor layer.

SUMMARY OF THE INVENTION

An objective of the present invention is to provide a thin multi-layer LED array engine, wherein the phosphor layer is disposed on the LED dices and makes direct contact with the substrate. Because the LED dices are covered with the phosphor layer, and the phosphor particles in the phosphor layer can be uniformly dispersed around the LED dices, so that the multi-layer array type LED package can have uniform distribution of color temperature.

Another objective of the present invention is to provide a thin multi-layer LED array engine, wherein the phosphor layer makes direct contacts with the substrate, and thereby heat generated in the phosphor layer can be effectively dissipated through the substrate, and thereby the reliability of the optical components can be increased.

BRIEF DESCRIPTION OF THE DRAWINGS

The present invention will be apparent to those skilled in the art by reading the following detailed description of a preferred embodiment thereof, with reference to the attached drawings, in which:

FIG. 3 B is a local enlarged view of an area 3B of FIG. 3 A;

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
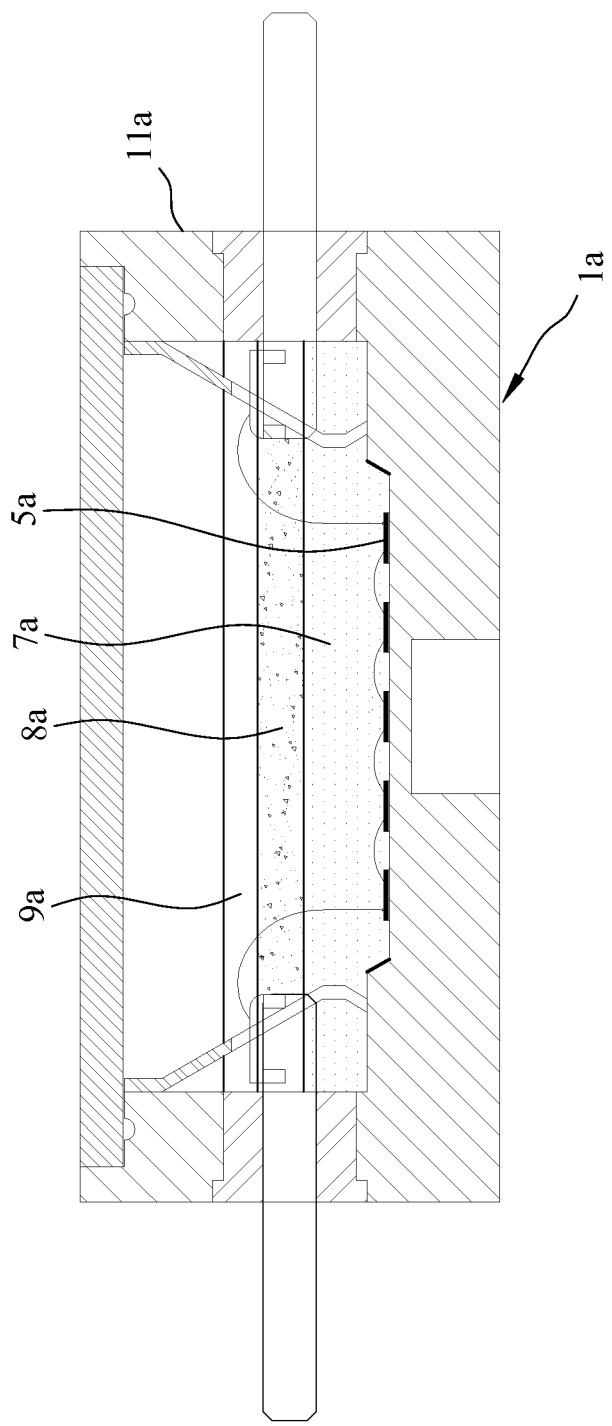
FIG. 1 is a cross-sectional view of a conventional airtight thin multi-layer LED array engine.
Figure 2:
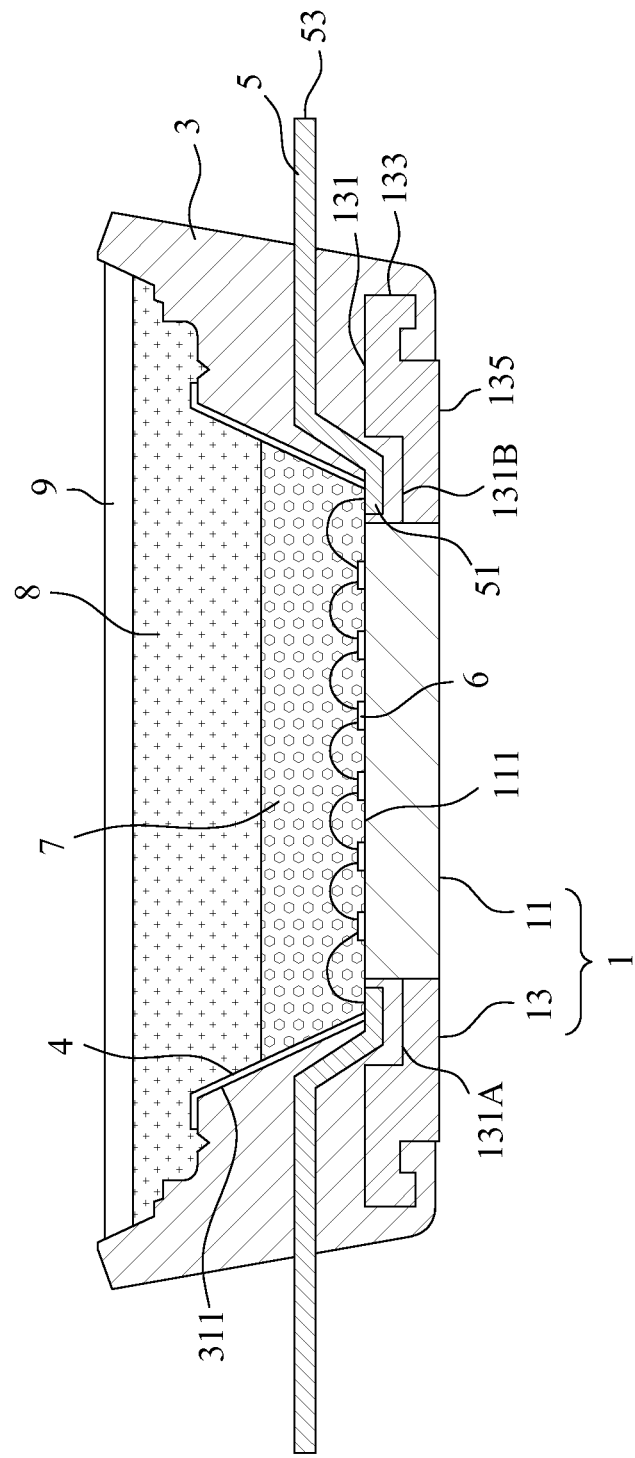
FIG. 2 is a cross-sectional view of a thin multi-layer LED array engine according to the first embodiment of the present invention.

FIG. 2 is a cross-sectional view of a thin multi-layer LED array engine according to a first embodiment of the present invention. Referring to FIG. 2, the thin multi-layer LED array engine of the present invention comprises a substrate 1, an encapsulation body 3, two lead frames 5, a plurality of LED dices 6, a phosphor layer 7, a silica gel insulating layer 8, and an optical lens 9.

The substrate has a central region 11, a peripheral region 13, and an edge. The top surface of the substrate 1 in the central region 11 is served as a light output surface 111. The central region 11 is larger than the peripheral region 13, and the peripheral region 13 lies between the edge and the central region 11, and the substrate 1 in the peripheral region 13 has a top surface 131, a lateral surface 133, and a bottom surface 135.

Figure 3A:
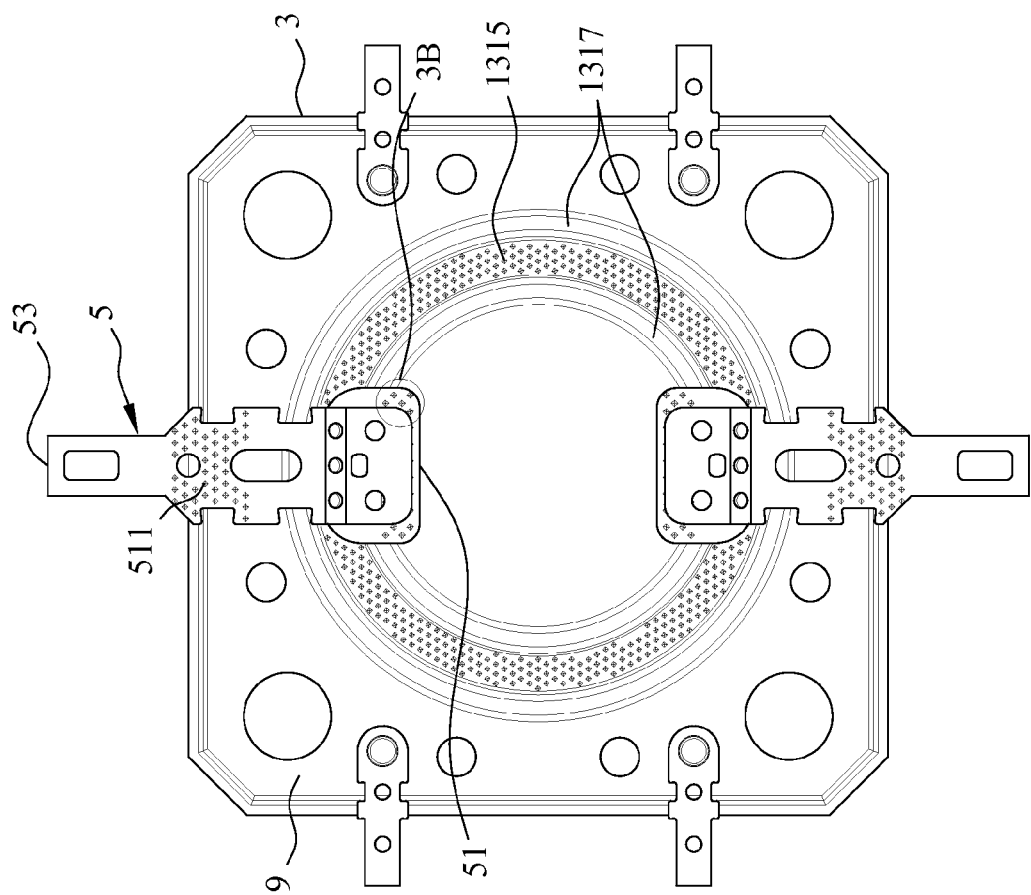
FIG. 3 A is a top view of the thin multi-layer LED array engine according to the present invention.
Figure 3B:
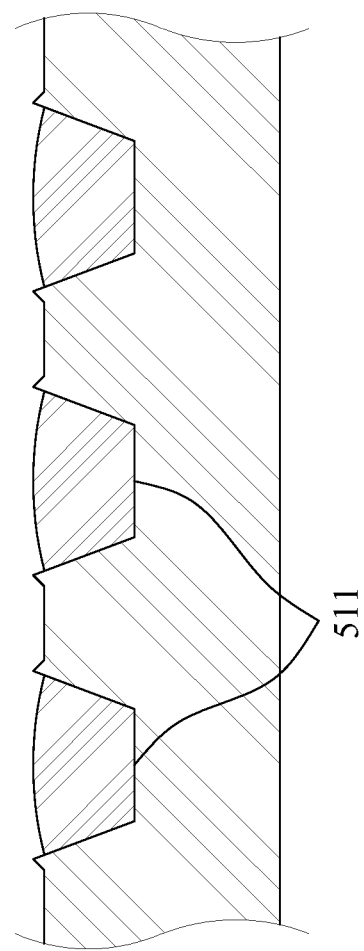

FIG. 3A is a top view of the thin multi-layer LED array engine according to the present invention. FIG. 3B is a local enlarged view of an area 3B of FIG. 3A. Referring to FIGS. 2, 3A and 3B, the thin multi-layer LED array engine of the present invention comprises a substrate 1, an encapsulation body 3, two lead frames 5, a plurality of LED dices 6, a phosphor layer 7, a silica gel insulating layer 8, and an optical lens 9. Two grooves 131A and 131B and a plurality of the first small cavities 1315 are formed on the top surface 131. Preferably, the two grooves 131A and 131B are respectively disposed at two opposite sides of the top surface 131, and are close to the light output surface 111. The first small cavities 1315 can be disposed in a ring shape, and disposed in the two grooves 131A and 131B. The central region 11 can be in round, elliptical, square, polygonal, or any other suitable shape.

The encapsulation body 3 is formed to encapsulate the peripheral region 13 including the top surface 131, the lateral surface 133 and the bottom surface 135, but not encapsulate the central region 11. The encapsulation body 3 has an encapsulation chamber 31 formed on the light output surface in the central region 11 which is not encapsulated by the encapsulation body 3. The encapsulation chamber 31 has an accommodating space formed by surrounding the central region 11 with the encapsulation body 3. The optical components can be disposed in the accommodating space. The bottom surface of the encapsulation chamber 31 is the light output surface 111.

The sidewall 311 of the encapsulation chamber 31 is inclined relative to the light output surface 111 of the substrate 1, and thus to allow the light emitted from the LED dices 6 to be reflected by the sidewall 311 and emitted outwardly. The angle between the sidewall 311 of the encapsulation chamber 31 and the light output surface 111 is preferably less than 90°. Furthermore, a reflector cap 4 can be disposed on the sidewall 311 of the encapsulation chamber 31, so that light emitted from the LED dices 6 can be more efficiently reflected outwardly, and thereby the brightness of the LED device is enhanced.

The reflector cap 4 is, for example, a specular reflector cap, or a diffuse reflector cap.

The encapsulation body 3 is formed to encapsulate the peripheral region 13 of the substrate 1. The material of the encapsulation body 3 includes a mold resin. The mold resin can be polyphthalamide (PPA) resin, or liquid crystal polymer (LCP) resin.

Referring to FIGS. 2, 3A and 3B, the two lead frames 5 each has an inner end portion 51 and an outer end portion 53. The inner end portions of the two lead frames 5 are disposed in the two grooves 131A and 131B, respectively. The level of the outer end portion 53 is higher than that of the inner end portion 51, as shown in FIG. 2. A portion of the lead frame 5 can be bent into a first extending portion (i.e. the inner end portion 51) and a second extending portion (i.e. the outer end portion 53).

The two lead frames 5 are electrically insulated from the substrate 1 by the encapsulation body 3. The inner end portions 51 of the two lead frames 5 are encapsulated by the encapsulation body 3, but the outer end portions 53 of the two lead frames 5 are exposed outside of the encapsulation body 3. A plurality of the second small cavities 511 are disposed on one surface of each lead frame 5. Preferably, the second small cavities 511 are disposed on the inner end portions 51 and in the vicinity of the inner end portions 51 of the two lead frames 5.

The first small cavities 1315 are used for increasing the adhesion of the encapsulation body 3 to the substrate 1, and the second small cavities 511 are used for increasing the adhesion of the encapsulation body 3 to the two lead frames 5. The two lead frames 5 are made from a conductive metal, and the encapsulation body 3 is made from plastic or resin, and the adhesion of metal to plastic or resin tends to be poor. The second small cavities 511 disposed on the two lead frames 5 can increase the roughness of the surfaces of the two lead frames 5, and can be filled up by the liquid plastic or resin which will be cured by heat treatments, so as to increase the adhesion of the encapsulation body 3 to the two lead frames 5. Therefore, the adhesion of the encapsulation body 3 to the two lead frames 5 is increased.

Referring to FIG. 3A, two ring-shaped grooves 1317 can be arranged in the two sides of the first small cavities 1315 which are disposed in a ring shape, respectively, in order to increase the adhesion of the encapsulation body 3 to the substrate 1 and the two lead frames 5. Therefore, the adhesion of the encapsulation body 3 to the two lead frames 5 can be further enhanced.

Referring to FIG. 2, the LED dices 6 are disposed on the light output surface 111, and arranged in an array manner, wherein the LED dices 6 are electrically connected to each other through wire bonding, and the LED dices 6 are electrically connected to the inner end portions 51 of the two lead frames 5 through wire bonding so as to form an electric circuit, and the outer end portions 53 of the two lead frames 5 are connected to the power source.

The LED dices 6 are fixed to the light output surface 111 of the substrate by a solder paste. The solder paste is, for example, tin solder or silver paste, wherein the tin solder can be mixed with carbon crystals, diamond, or nickel, silver or other thermally conductive materials coated diamond. The solder paste containing the thermally conductive materials is capable of effectively dissipating heat generated from the LED dices 6 out of the LED device.

The phosphor layer 7 is disposed on the LED dices 6, and makes direct contact with the substrate. Because the LED dices 6 are covered with the phosphor layer 7, the phosphor particles in the phosphor layer 7 can be uniformly dispersed around the LED dices 6, so that the narrow color temperature distribution can be achieved.

Because the phosphor layer 7 makes direct contacts with the substrate 1, heat generated in the phosphor layer 7 can be effectively dissipated through the substrate 1, and thereby the reliability of the optical components can be increased.

Figure 9:
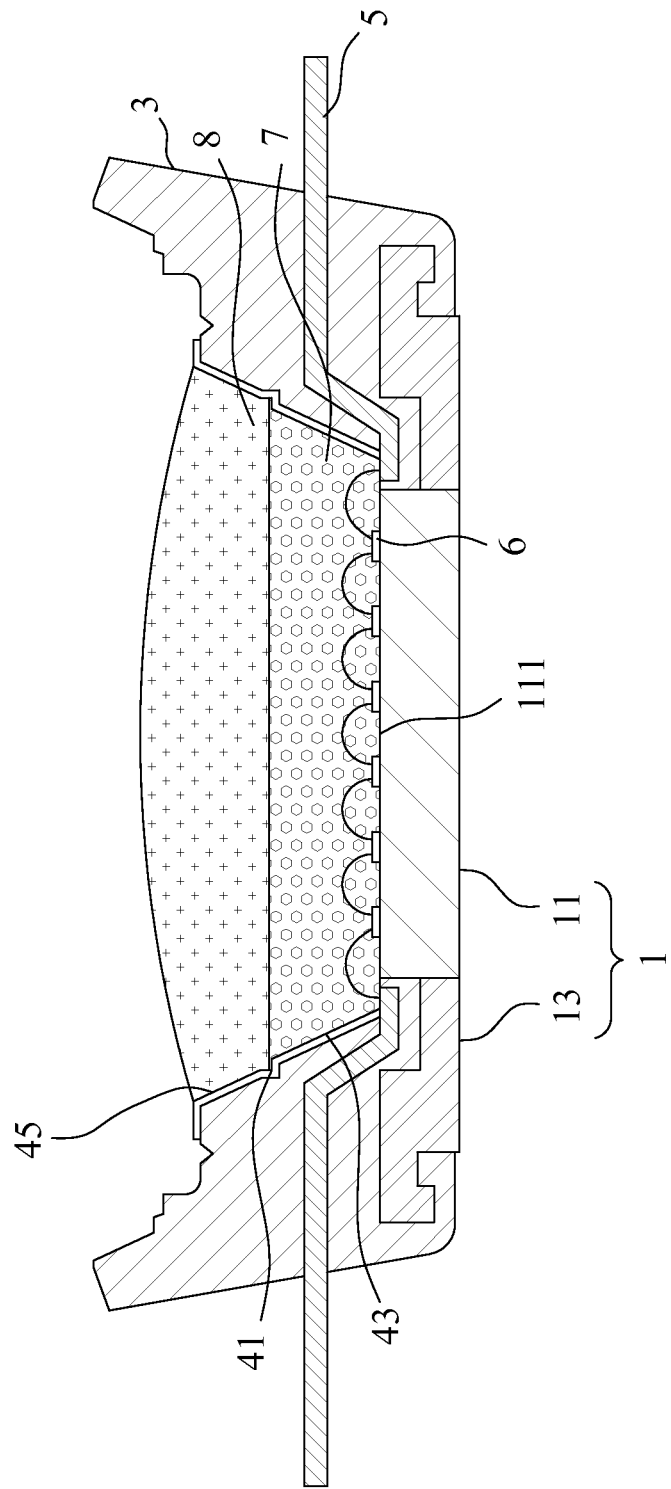
FIG. 9 is a cross-sectional view of a thin multi-layer LED array engine according to a sixth embodiment of the present invention.

A silica gel protection layer 8 is disposed on the phosphor layer 7, as shown in FIG. 9. The silica gel protection layer 8 is capable of preventing moisture from permeating into the phosphor layer 7 disposed thereunder. Therefore, the phosphor layer 7 will not be deteriorated by exposure to moisture.

As shown in FIG. 9, the thin multi-layer LED array engine according to this embodiment of the present invention does not include an optical lens.

Figure 8:
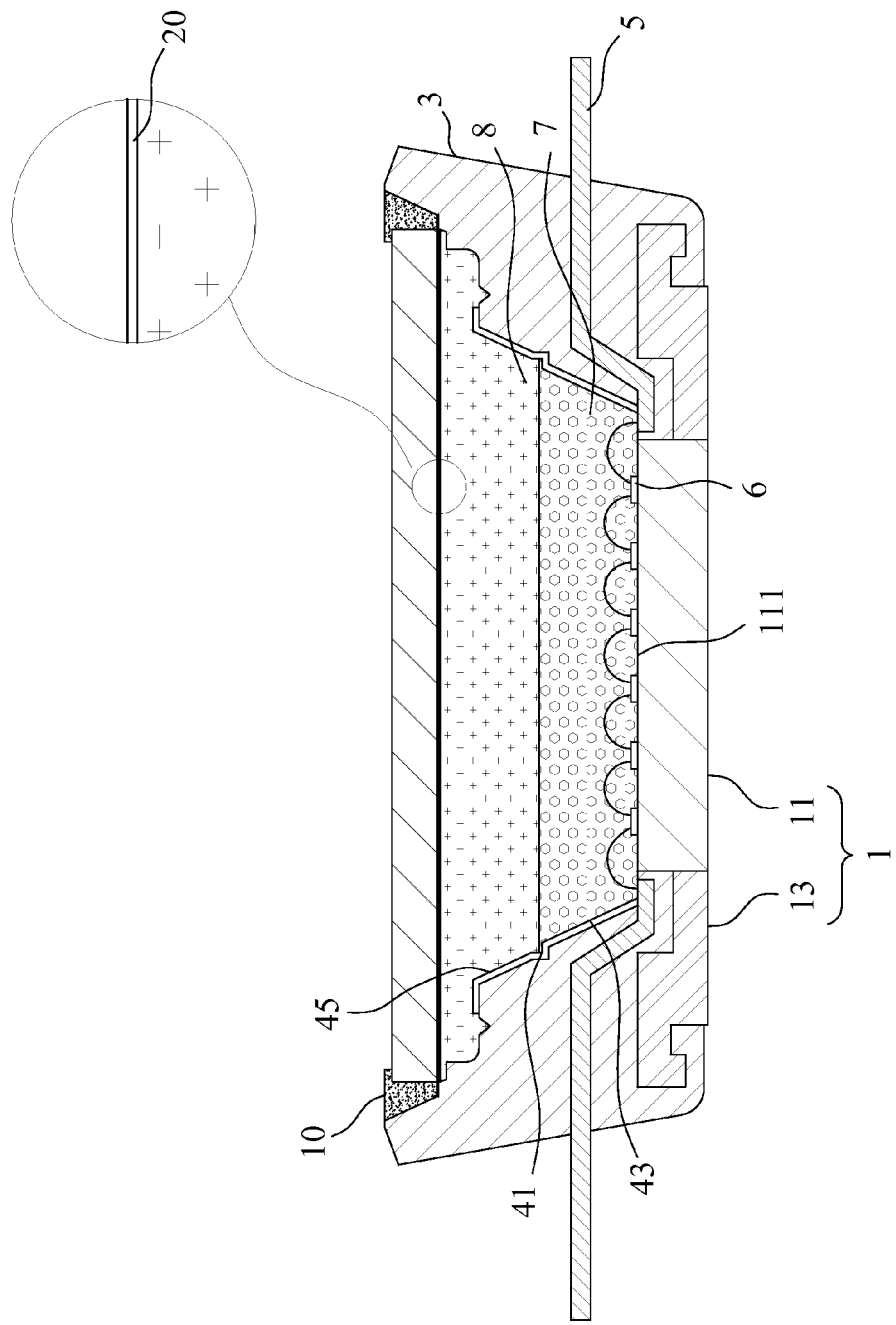
FIG. 8 is a cross-sectional view of a thin multi-layer LED array engine according to a fifth embodiment of the present invention.

An optical lens 9 is disposed on the silica gel protection layer 8. The optical lens 9 can be a glass lens, a silicone lens, or other suitable lens, as shown in FIG. 8.

Figure 4:
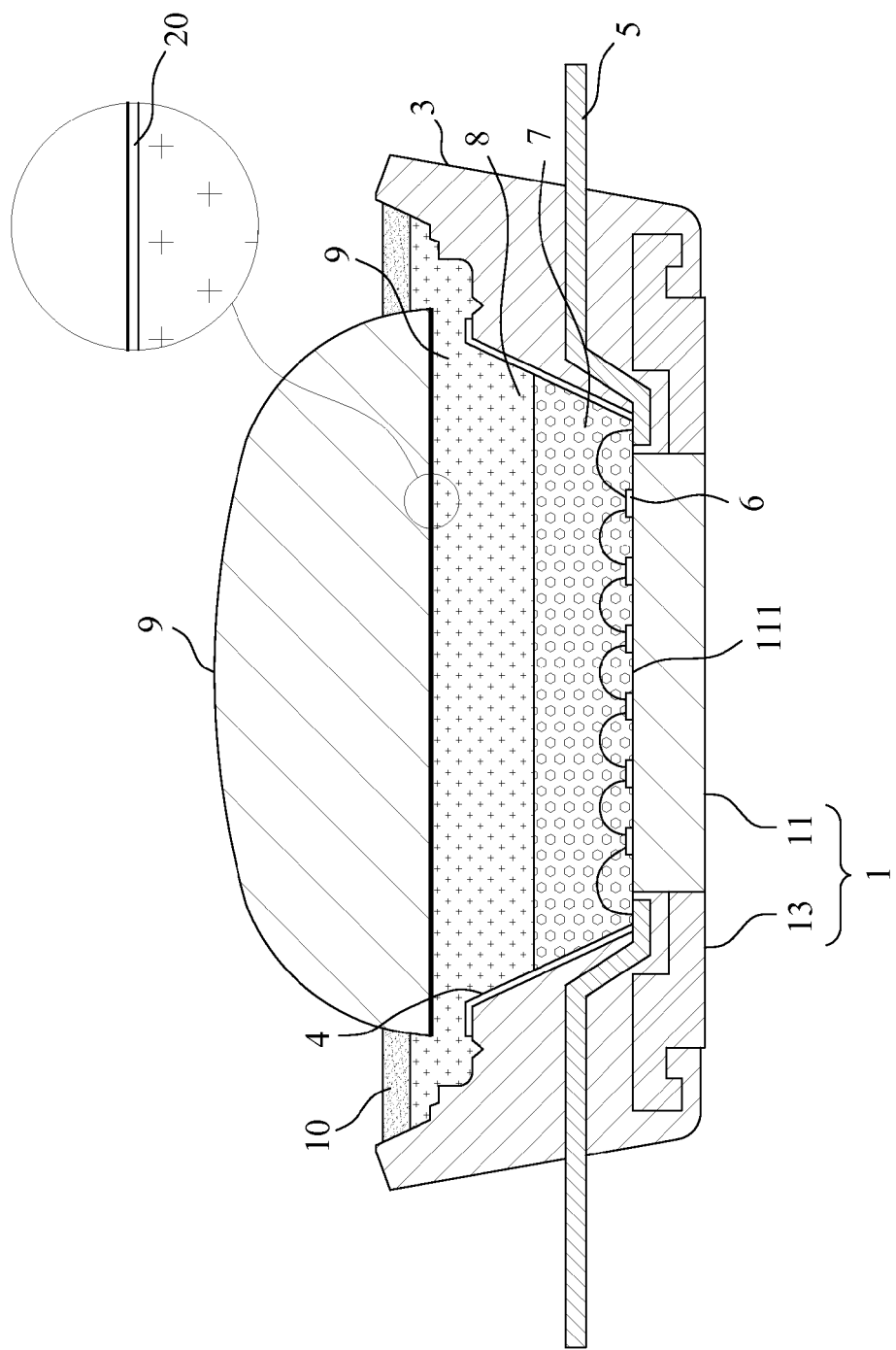
FIG. 4 is a cross-sectional view of a thin multi-layer LED array engine according to a second embodiment of the present invention.

FIG. 4 is a cross-sectional view of a thin multi-layer LED array engine according to a second embodiment of the present invention. Referring to FIG. 4, the optical lens 9 is fixed on the silica gel protection layer 8 by an underfilling layer 10, and the optical lens 9 is not in contact with the reflector 5. The silica gel protection layer 8 and the optical lens 9 are made of plastic, and thereby the optical lens 9 can be tightly fixed on the silica gel protection layer 8, and the optical lens 9 can be further fixed by the underfilling layer 10, so that the optical lens 9 will not be loose. The material of the underfilling layer 10 can be an epoxy resin.

A primer 20 can be coated between the silica gel protection layer 8 and the optical lens 9. The primer 20 is used to increase the air-tightness of the silica gel protection layer 8 and the optical lens 9, and to prevent moisture from permeating into the phosphor layer 7 disposed under the silica gel protection layer 8.

Figure 5:
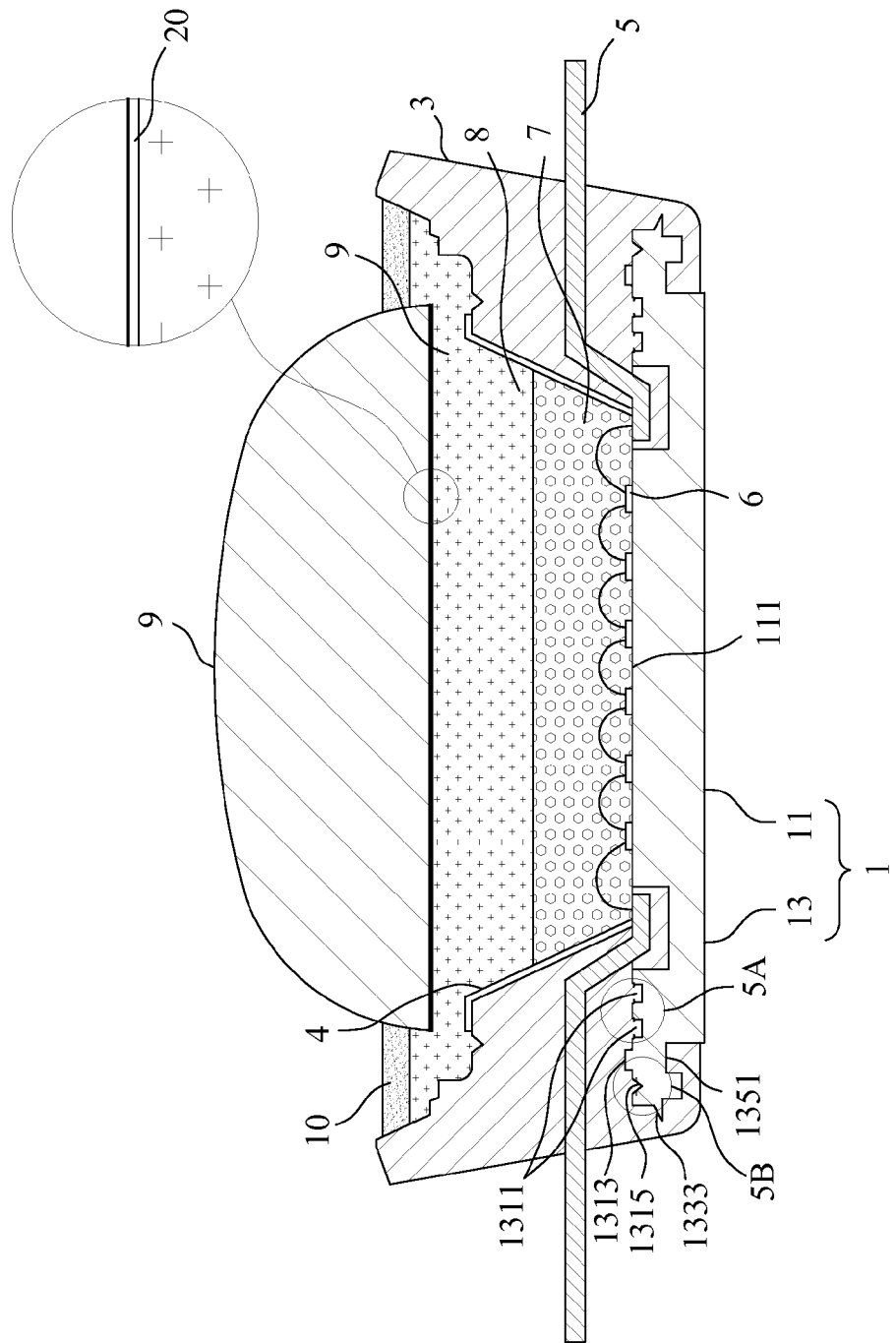
FIG. 5 is a cross-sectional view of the thin multi-layer LED array engine according to a preferred embodiment of the present invention.

FIG. 5 is a cross-sectional view of the thin multi-layer LED array engine according to one preferred embodiment of the present invention. Referring to FIG. 5, the optical lens 9 is fixed on the silica gel protection layer 8 by an underfilling layer 10, and the optical lens 9 is not in contact with the reflector 5. The silica gel protection layer 8 and the optical lens 9 are made of plastic, and thereby the optical lens 9 can be tightly fixed on the silica gel protection layer 8, and the optical lens 9 can be further fixed by the underfilling layer 10, so that the optical lens 9 will not be loose. The material of the underfilling layer 10 can be an epoxy resin.

Two upper first grooves 1311, one upper convex portion 1313, and one upper second groove 1315 are sequentially disposed on the top surface 131 in the peripheral region 13 from an inner side to an outer side of the top surface 131. The two upper first grooves 131 are concave-shaped, and the upper second groove 1315 is V-shaped. A lateral convex portion 1333 is disposed on the lateral surface 133 in the peripheral region 13. An L-shaped structure is defined by the lateral convex portion 1333 and the lateral surface 133. One lower groove 1351 is disposed on the bottom surface 135.

Figure 5A:
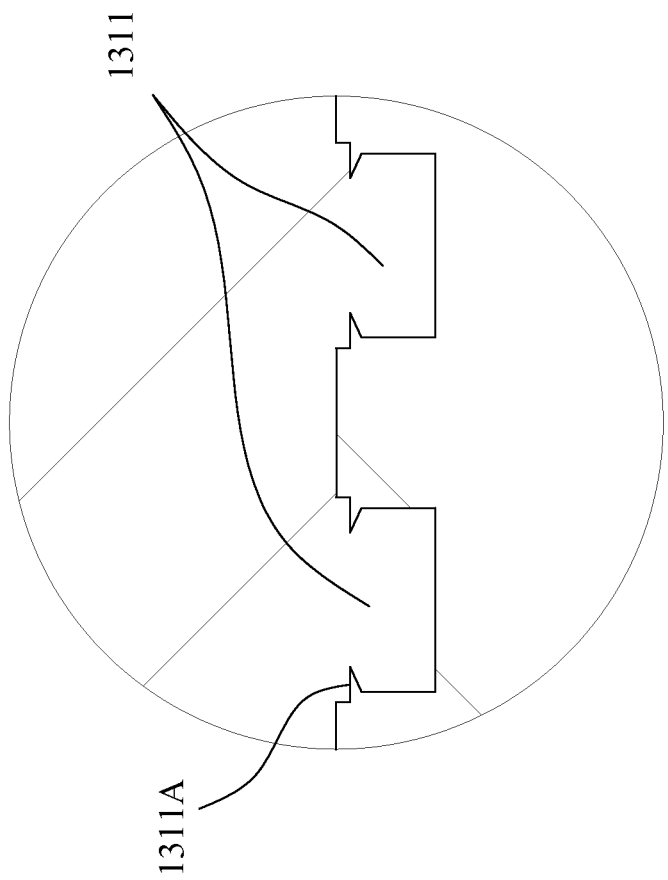
FIG. 5A is a local enlarged view of an area 5A of FIG. 5.
Figure 5B:
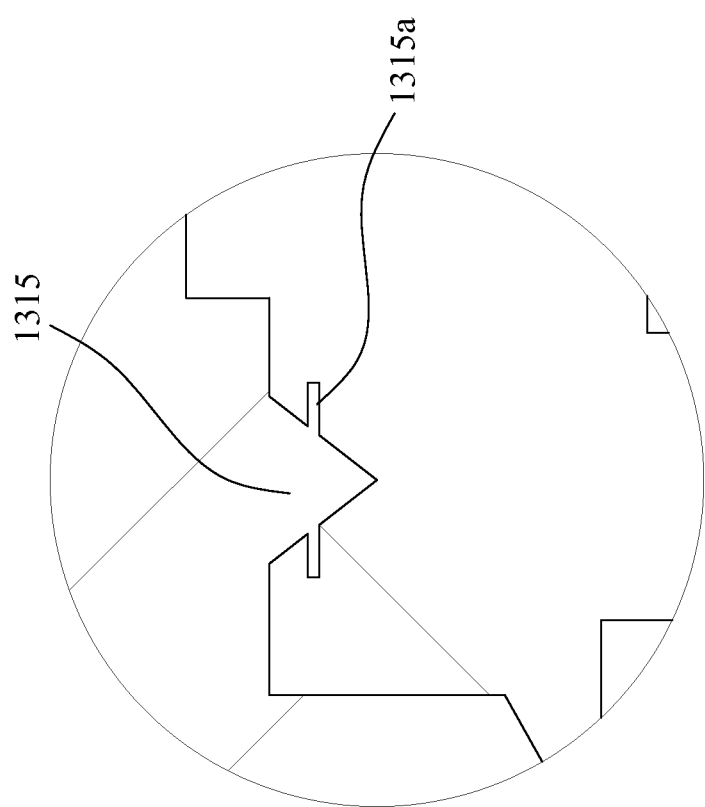
FIG. 5B is a local enlarged view of an area 5B of FIG. 5.

FIG. 5A is a local enlarged view of an area 5A of FIG. 5. FIG. 5B is a local enlarged view of an area 5B of FIG. 5. Referring to FIGS. 5A and 5B, the convex flanges 1311*a* are disposed on the inner sidewalls of the two upper first grooves 131. The concave flanges 1315*a* are disposed on the inner sidewall of the upper second groove 1315.

The above-mentioned grooves can be filled up with the liquid encapsulation material. After the encapsulation material is cured, the encapsulation body 3 is formed and engaged with the substrate 1. Therefore, the encapsulation body 3 is tightly bonded to the substrate 1.

Figure 6:
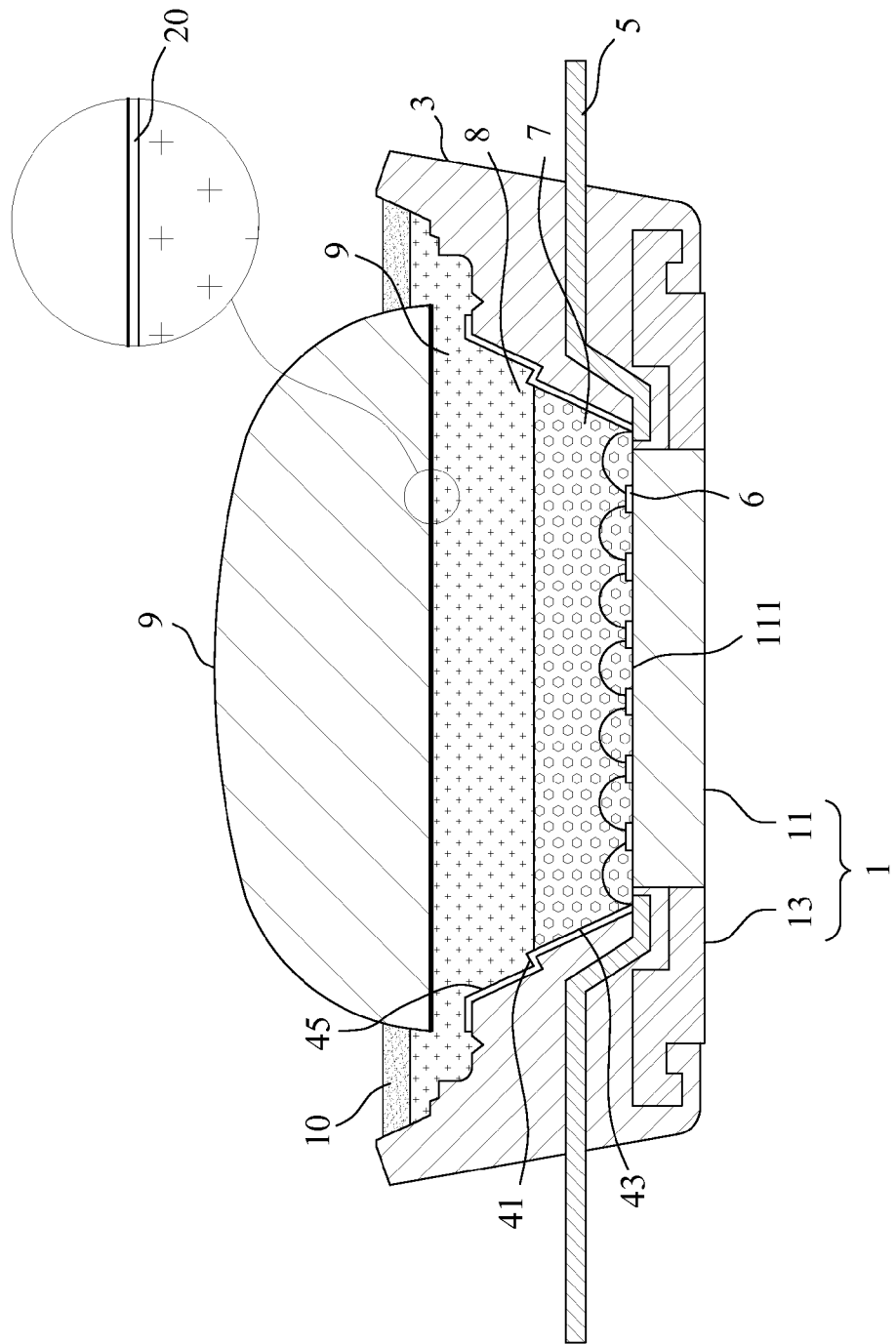
FIG. 6 is a cross-sectional view of a thin multi-layer LED array engine according to a third embodiment of the present invention.
Figure 7:
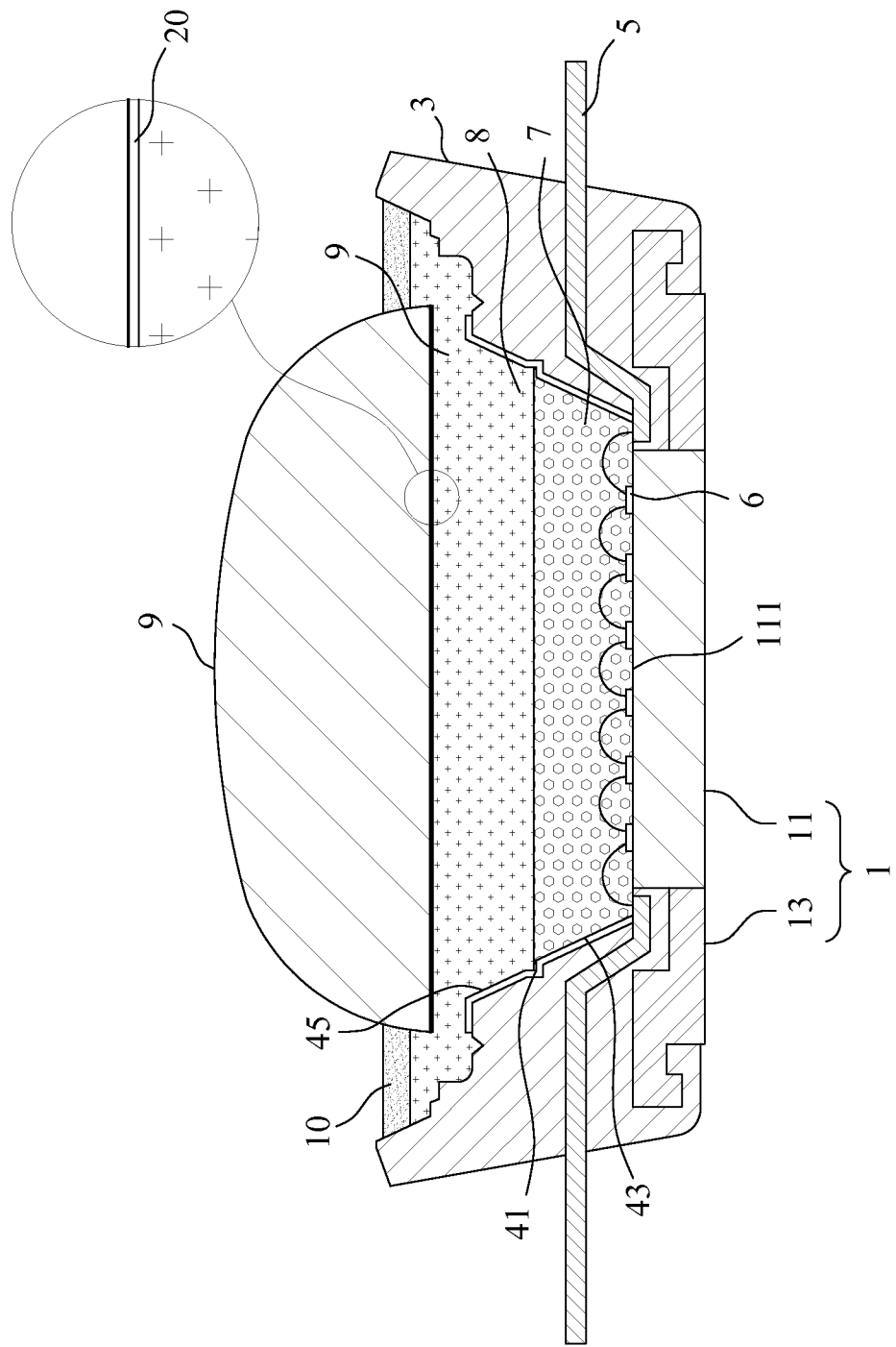
FIG. 7 is a cross-sectional view of a thin multi-layer LED array engine according to a fourth embodiment of the present invention.

FIG. 6 is a cross-sectional view of a thin multi-layer LED array engine according to a third embodiment of the present invention. FIG. 7 is a cross-sectional view of a thin multi-layer LED array engine according to a fourth embodiment of the present invention. Referring to FIG. 6, the reflector cap 4 can has a bent portion 41, an upper portion 45 above the bent portion 41, and a lower portion 43 below the bent portion 41.

Preferably, the bent portion 41 of the reflector cap 4 is located at the interface between the phosphor layer 7 and the silica gel protection layer 8. The reflector cap 4 has at least one bent portion 41 bent away from the phosphor layer 7. An L-shaped structure is defined by the lower portion 43 and the bent portion 41. The angle between the bent portion 41 and the surface of the phosphor layer 7 is in the range of 180° to 270°.

Referring to FIG. 7, the reflector cap 4 can has a "<"-shaped bent portion 41 bent away from the phosphor layer 7 and further bent toward the phosphor layer 7.

When the liquid medium containing the phosphor particles is filled to the level of the bent portion 41, the liquid medium will not flow toward the bent portion 41 because of the cohesive forces among the liquid medium molecules. Consequently, the liquid medium will contract to the minimal area caused by cohesion, and the phosphor layer 7, which is formed by curing the liquid medium, will have a concave surface. When the light emitted from the LED dices 6 passes through the concave surface of the phosphor layer 7, the light will be emitted outwardly with uniform color temperature, and thereby the yellow halo phenomenon will be eliminated.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A thin multi-layer LED array engine, comprising:
   a substrate, including a central region, a peripheral region, and an edge, a top surface of the substrate in the central region being served as a light output surface, the peripheral region lying between the edge and the central region, the substrate in the peripheral region having a top surface with two grooves formed thereon, a lateral surface, and a bottom surface;
   an encapsulation body, encapsulating the peripheral region including the top surface, the lateral surface and the bottom surface, but not encapsulating the central region, the encapsulation body having an encapsulation chamber formed on the light output surface;
   two lead frames, each of the two lead frames having an inner end portion and an outer end portion, the inner end portions of the two lead frames being disposed in the two grooves on the top surface of the substrate in the peripheral region, respectively, the inner end portions of the two lead frames being encapsulated by the encapsulation body, but the outer end portions of the two lead frames are exposed outside of the encapsulation body;
   a plurality of LED dices, disposed on the light output surface, the LED dices being electrically connected to the two lead frames;
   a phosphor layer, disposed on the LED dices, the phosphor layer making direct contact with the substrate; and
   a silica gel protection layer, disposed on the phosphor layer;
   wherein a plurality of first small cavities are formed on the top surface, and two ring-shaped grooves are arranged in two sides of the first small cavities.

2. The thin multi-layer LED array engine according to claim 1, wherein the two grooves on the top surface are respectively disposed at two opposite sides of the top surface.

3. The thin multi-layer LED array engine according to claim 1, wherein the encapsulation chamber has a sidewall, the sidewall being inclined relative to the light output surface of the substrate.

4. The thin multi-layer LED array engine according to claim 3, wherein a reflector cap is disposed on the sidewall of the encapsulation chamber, and the reflector cap is a specular reflector cap, or a diffuse reflector cap.

5. The thin multi-layer LED array engine according to claim 4, wherein the reflector cap has at least one bent portion bent away from the phosphor layer.

6. The thin multi-layer LED array engine according to claim 5, wherein the reflector cap has an upper portion above the bent portion, and a lower portion below the bent portion, and an L-shaped structure is defined by the lower portion and the bent portion, and an angle between the bent portion and a surface of the phosphor layer is in the range of 180° to 270°.

7. The thin multi-layer LED array engine according to claim 5, wherein the reflector cap has a bent portion bent away from the phosphor layer, and further bent toward the phosphor layer.

8. The thin multi-layer LED array engine according to claim 1, wherein the encapsulation body is formed to encapsulate the peripheral region of the substrate.

9. The thin multi-layer LED array engine according to claim 8, wherein a material of the encapsulation body is includes a mold resin.

10. The thin multi-layer LED array engine according to claim 9, wherein the mold resin is polyphthalamide (PPA) resin, or liquid crystal polymer (LCP) resin.

11. The thin multi-layer LED array engine according to claim 1, wherein the two lead frames are electrically insulated from the substrate by the encapsulation body.

12. The thin multi-layer LED array engine according to claim 1, wherein a plurality of the second cavities are disposed on one surface of each of the two lead frames.

13. The thin multi-layer LED array engine according to claim 12, wherein the second small cavities are disposed on the inner end portions and in the vicinity of the inner end portions 51 of the two lead frames.

14. The thin multi-layer LED array engine according to claim 1, wherein the LED dices are disposed on the light output surface, and arranged in an array manner.

15. The thin multi-layer LED array engine according to claim 1, wherein the LED dices are electrically connected to the two lead frames through wire bonding.

16. The thin multi-layer LED array engine according to claim 1, wherein the LED dices are fixed to the light output surface of the substrate by a solder paste.

17. The thin multi-layer LED array engine according to claim 16, wherein the solder paste includes tin solder, and silver paste.

18. The thin multi-layer LED array engine according to claim 17, wherein the tin solder is mixed with carbon crystals, diamond, or nickel-coated diamond.

19. The thin multi-layer LED array engine according to claim 1, further comprising an optical lens which is disposed on the silica gel protection layer.

20. The thin multi-layer LED array engine according to claim 19, wherein the optical lens is a glass lens, or a silicone lens.

21. The thin multi-layer LED array engine according to claim 1, wherein the optical lens is fixed on the silica gel protection layer by an underfilling layer, and a material of the underfilling layer is an epoxy resin.

22. The thin multi-layer LED array engine according to claim 21, wherein a primer is coated between the silica gel protection layer and the optical lens.

23. The thin multi-layer LED array engine according to claim 1, wherein the first small cavities are disposed in a ring shape.

* * * * *